Jan. 21, 1969 A. A. ZAFFRANN ET AL 3,423,719

MOUNTING HARDWARE FOR PRINTED CIRCUIT CARDS

Filed Dec. 26, 1967

INVENTORS
Albert A. Zaffrann
Joseph A. Balint
Siegfried Weidmann

BY Richard C. Steinmetz Jr.
ATTORNEY

1

3,423,719
MOUNTING HARDWARE FOR PRINTED CIRCUIT CARDS

Albert A. Zaffrann, Milwaukee, Joseph A. Balint, Wauwatosa, and Siegfried Weidmann, Milwaukee, Wis., assignors to Allen Bradley Company, Milwaukee, Wis., a corporation of Wisconsin Filed Dec. 26, 1967, Ser. No. 693,363
U.S. Cl. 339—121 5 Claims
Int. Cl. H01r 13/60; H05k 1/00

ABSTRACT OF THE DISCLOSURE

Adjustable mounting means for printed circuit boards and board-receiving electrical connectors, comprising sets of spaced mounting rods having board-receiving guide channels which are adjustably slidingly attached to the rods and arranged to slidingly receive opposite edges of the boards; and the electrical connectors being slidingly adjustably attached at the ends thereof to a further pair of rods, for adjustable alignment of the boards and connectors. A grounding bus for the connectors extends along one of the connector-supporting rods.

Hardware to mount and hold printed circuit cards is presently available using a variety of designs. This invention represents an improvement over known structure in that it substantially simplifies and thereby improves upon assembly methods and processes as well as providing increased flexibility for the use of electrical components of differing size and construction with the consequential variation in printed circuit card size and construction. The more conventional hardware for printed circuit card mounting ties the electrical connector directly to the guides used to guide the printed circuit card. For example, the electrical connector may be bolted or even permanently attached to the printed circuit card guide.

An improvement of this invention is found in mounting the electrical connector independently of the prinited circuit card guide means. More specifically, the electrical connector is mounted on rail means through intermediate and independent mounting clips. These clips include snap-on means which fasten to the rail means and thereby permanently locate the electrical connector. Additional clamping means which are a part of the mounting clips hold the electrical connector.

By locating the electrical connector independently of the printed circuit card guides, it becomes possible to use a variety of printed circuit cards and electrical connectors with a minimum of structural change to the mounting hardware. This improvement is particularly significant, because the variously shaped and designed printed circuit cards and electrical connectors do not permit the use of a universal printed circuit card guide. Therefore, it is necessary to change the printed circuit card guide—which represents the bulk of the mounting hardware—when a printed circuit card or electrical connector of a different size or design is to be added, substituted or modified through redesign. These changes are a common occurrence. When such a change is contemplated for structure incorporating the invention disclosed herein, the printed circuit card guides remain intact and the independent mounting clips are changed so as to accept the new style electrical connector.

Further advantages are seen from the invention through the minimum time and effort necessary for assembly; particularly for those installations in which a plurality of printed circuit cards are used in a side-by-side arrangement—and especially with a further arrangement utilizing cards stacked one above the other. The above mentioned independence of the hardware for mounting the electrical

2 connector permits flexibility in hardware assembly techniques and methods; which flexibility is not to be found in the available mounting hardware where the mounting hardware components are unsatisfactorily dependent upon each other. When a plurality of printed circuit cards are to be mounted in a small space this flexibility has a particular advantage. Added advantage results from incorporating snap-on fastening means for attachment to independent support structure of the mounting hardware.

The following written description and the accompanying drawings depict a specific form of the invention for illustrative purposes only. Attention is directed to the appended claims which set forth the scope of the invention.

Figure 1:
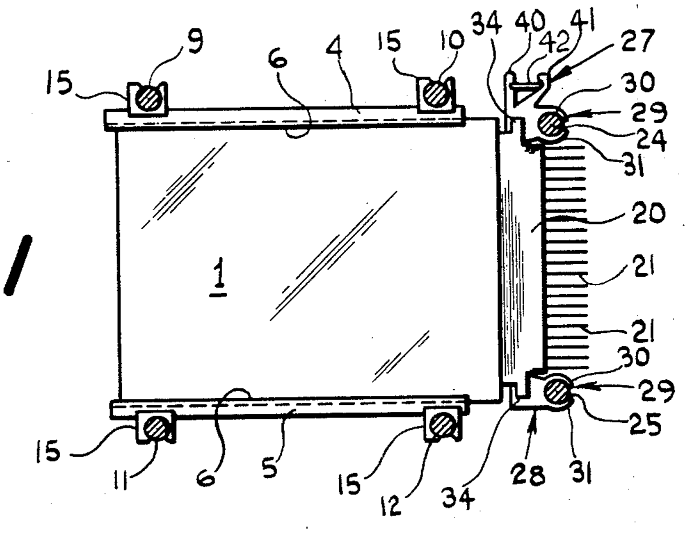
FIGURE 1 is a cross-sectional side view taken along line 1—1 of FIGURE 3 and shows a single printed circuit card mounted in the hardware of the invention.

In the FIGURE 1, the printed circuit board 1 is shown by representation and is held on two sides by guide means 4 and 5. Each of the guide means 4 and 5 has an elongated slot 6, in which the printed circuit card 1 rests and is guided.

Support means in the form of rail means locates the guide means 4 and 5 as is shown in FIGURE 1. This support structure is shown as rail means 9 and 10 upon which the guide means 4 is mounted and rail means 11 and 12 upon which guide means 5 is mounted. Mounting of the guide means 4 and 5 is accomplished through flexible clamping structure 15 which in each case is integral to the guide means 4 or 5, respectively, and which snaps on over the respective rail means 9 through 12.

Figure 3:
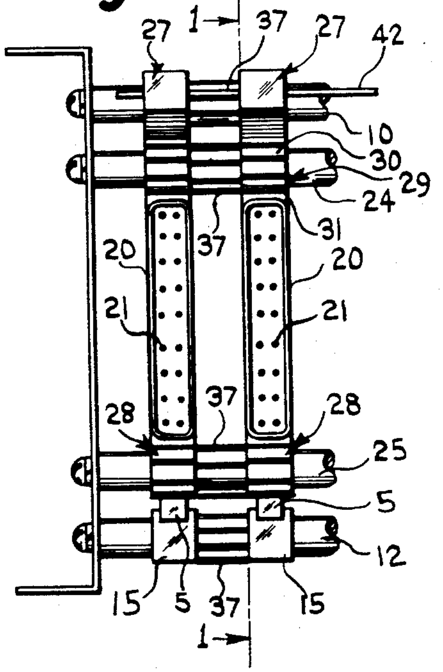
FIGURE 3 is an end view of the invention showing a plurality of electrical connectors and hardware mounting structure therefor.

The electrical connector 20 in FIGURE 1 is of conventional construction having a plurality of pin terminals 21 extending therefrom. As is shown in FIGURE 3, the installation for the hardware to be used in mounting the printed circuit cards of this invention may have a plurality of electrical connectors for a plurality of printed circuit cards.

It is particularly significant to the invention that this electrical connector 20 be mounted independently of the guide means 4 and 5. As is shown in the drawings, such mounting of the electrical connector 20 is accomplished through support means in the form of rail means 24 and 25. Mounting clips 27 and 28, which are independent of the electrical connector 20, are used to accomplish the necessary mounting on the rail means 24 and 25. Specifically, each of the mounting clips 27 and 28 includes snap-on means 29 in the form of flexible curved fingers 30 and 31 which snap over the rail means 24 and 25.

In addition, the mounting clips 27 and 28 include clamping means 34 shown in the form of a resilient recess into which the electrical connector 20 is inserted. The mounting clips 27 and 28 are preferably made of a plastic type material so that the snap-on means 29 and the clamping means 34 will be resiliently flexible. Therefore, the respective connection by the mounting clips 27 and 28 with the electrical connector 20 and the rail means 24 and 25 will be tight and substantially permanent in fit.

It will be seen, then, that the hardware for the printed circuit card 1 can be easily assembled merely by snapping the guide means 4 and 5 onto the respective rail means 9–12 and by snapping the mounting clips 27 and 28 on the respective rail means 24 and 25. Any order or combination of assembling the hardware mounting structure is possible. Moreover, should it be decided to use a different style or design of electrical connector 20 for several of the printed circuit cards 1 (e.g., to accommodate a different type printed circuit card) it is only necessary, at a maximum to substitute for the mounting clips 27 and 28 in order to accommodate the style or size of the new connector 20. Preferably, the rail means 9 through 12 are substantially normal to the guide means 4 and 5 and the rail means 24 and 25 are substantially normal to the connector 20 in order to accommodate a plurality of circuit cards 1 in a minimum of space.

Figure 2:
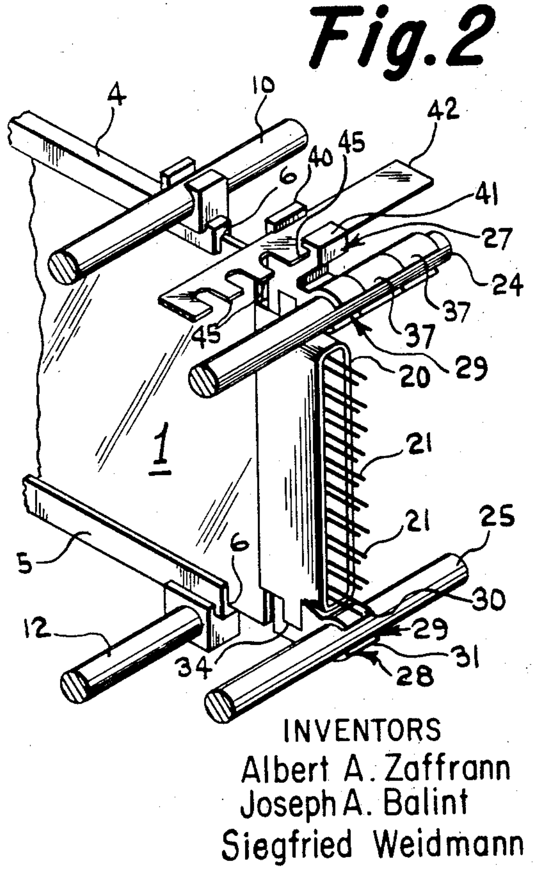
FIGURE 2 is a partial isometric view of the invention showing the rear of the printed circuit card, guide means, in part, as well as the electrical connector and the mounting clips therefor.

Additional features of the invention include the use of snap-on spacers 37 and provision in the mounting clips, such as mounting clip 27, for fingers 40 and 41 to hold a bus bar 42. As is seen in FIGURE 2 this bus bar may have terminal connections 45 over which push-on terminal tabs may be inserted. Thus, a bus bar 42 may, for example, provide the necessary grounding for each of the electrical connectors 20 with appropriate connection made between one of the terminal pins 21 and a terminal 45.

We claim:

1. Hardware for mounting a printed circuit card comprising, (a) elongated spaced guide means with slots therein, said guide means located so as to accept a printed circuit card in said slots, (b) first support means independently supporting said guide means, (c) an electrical connector located between said guide means so as to accept an electrical connection portion of said printed circuit card, (d) second support means comprising at least two rail means adjacent said electrical connector, (e) independent mounting clips holding said electrical connector to said second support means.

2. The mounting hardware of claim 1 wherein (a) said first support means comprises at least two rail means adjacent each guide means, (b) said guide means have resilient clamping means which snap on over said adjacent rail means.

3. The mounting means of claim 2 wherein (a) said rail means of said first support means are substantially normal to said guide means, (b) said rail means of said second support means are substantially normal to said electrical connector.

4. The hardware of claim 1 wherein at least one said independent mounting clip includes second clamping means to hold bus bar means.

5. The hardware of claim 1 wherein said mounting clip comprises, (a) resilient finger means to snap on over said rail means, and (b) clamping means to hold said electrical connector.

References Cited

UNITED STATES PATENTS

| | | | |
|---|---|---|---|
| 2,872,624 | 2/1959 | Belek et al. | 339—17 |
| 2,983,897 | 5/1961 | Blanchet | 339—198 |
| 3,017,232 | 1/1962 | Schwab et al. | 339—176 |
| 3,360,689 | 12/1967 | Haury | 339—17 X |

RICHARD E. MOORE, *Primary Examiner.*

U.S. Cl. X.R.

339—17